US006491978B1

(12) United States Patent
Kalyanam

(10) Patent No.: US 6,491,978 B1
(45) Date of Patent: Dec. 10, 2002

(54) DEPOSITION OF CVD LAYERS FOR COPPER METALLIZATION USING NOVEL METAL ORGANIC CHEMICAL VAPOR DEPOSITION (MOCVD) PRECURSORS

(75) Inventor: Jagadish Kalyanam, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/612,854

(22) Filed: Jul. 10, 2000

(51) Int. Cl.$^7$ ............... C23C 16/16; C23C 16/18; C23C 16/34

(52) U.S. Cl. .............. 427/255.394; 427/569; 427/576; 427/250; 427/255.23; 427/255.7; 438/681; 438/685

(58) Field of Search ............... 427/533, 535, 427/569, 250, 252, 255.14, 255.394, 534, 573, 576, 255.23, 255.28, 255.392, 255.7, 436; 438/648, 656, 681, 683, 685, 687, 776, 785; 106/1.25, 287.24, 287.13, 287.14

(56) References Cited

U.S. PATENT DOCUMENTS

| | | | | |
|---|---|---|---|---|
| 4,690,728 A | * | 9/1987 | Tsang et al. | 156/643 |
| 4,992,305 A | | 2/1991 | Erbil | 427/252 |
| 5,139,825 A | | 8/1992 | Gordon et al. | 427/255.2 |
| 5,178,911 A | | 1/1993 | Gordon et al. | 427/255.2 |
| 5,403,620 A | * | 4/1995 | Kaesz et al. | 427/252 |
| 5,633,199 A | | 5/1997 | Fiordalice et al. | 438/642 |
| 5,856,236 A | * | 1/1999 | Lai et al. | 438/681 |
| 5,900,498 A | | 5/1999 | Winter et al. | 556/51 |
| 5,908,947 A | | 6/1999 | Vaartstra | 556/42 |
| 5,929,266 A | | 7/1999 | Jones et al. | 556/53 |
| 5,960,320 A | * | 9/1999 | Park | 438/660 |
| 6,027,860 A | * | 2/2000 | McClure et al. | 430/314 |
| 6,124,203 A | * | 9/2000 | Joo et al. | 438/653 |
| 6,177,347 B1 | * | 1/2001 | Liu et al. | 438/675 |
| 6,238,734 B1 | * | 5/2001 | Senzaki et al. | 427/226 |

OTHER PUBLICATIONS

Renaud Fix, Roy G. Gordon, and David M. Hoffman, "Chemical Vapor Deposition of Vanadium, Niobium, and Tantalum Nitride Thin Films," American Chemical Society, 1993, pp. 614–619.

Ajit Paranjpe, Randhir Bubber, Lino Velo, Guihua Shang, Sanjay Gopinath, Jeremie Dalton and Mehrdad Moslehi, "CVD Tan Barrier for Copper Metallization and DRAM Bottom Electrode," IEEE, Jun. 1999, pp. 99–119 to 99–121.

Thomas E. Bitterwolf, Skip Gallagher, Arnold L. Rheingold, Glenn P.A. Yap, "Ring Functionalized Cyclopentadienyl Derivatives of Niobium and Tantalum: Molecular Structures," Journal of Organo Metallic Chemistry, 1997, pp. 27–33.

Thomas E. Bitterwolf, Skip Gallagher, Arnold L. Rheingold, Glenn P.A. Yap, "Ring Functionalized Cyclopentadienyl Derivatives of Niobium and Tantalum: Molecular Structures," Journal of Organo Metallic Chemistry, 1998, pp. 77–92, 17 pages.

\* cited by examiner

Primary Examiner—Shrive P. Beck
Assistant Examiner—Wesley Markham
(74) Attorney, Agent, or Firm—Moser, Patterson & Sheridan

(57) ABSTRACT

A method and apparatus for depositing a metal and/or metal nitride layer on a substrate by the thermal or plasma enhanced disassociation of an organometallic precursor having the formula of $(Cp(R)_n)_xM(CO)_{y-x}$, in the presence of a processing gas, such as argon, hydrogen, or ammonia. In one embodiment the metal or metal nitride film is deposited at a pressure of less than about 20 Torr. The deposited metal or metal nitride layer may then be exposed to a plasma to remove contaminants, densify the layer, and reduce layer resistivity. The layer is useful as a liner or barrier layer for conducting metals and high dielectric constant materials in integrated circuit manufacturing.

29 Claims, 7 Drawing Sheets

DEPOSITION OF CVD LAYERS FOR COPPER METALLIZATION USING NOVEL METAL ORGANIC CHEMICAL VAPOR DEPOSITION (MOCVD) PRECURSORS

BACKGROUND OF THE INVENTION

1. Field of the Invention

The invention generally relates to the fabrication of integrated circuits and a method for depositing metal layers by chemical vapor deposition.

2. Background of the Related Art

Reliably producing sub-half micron and smaller features is one of the key technologies for the next generation of very large scale integration (VLSI) and ultra large scale integration (ULSI) integrated circuits. However, as the fringes of circuit technology are pressed, the shrinking dimensions of interconnects in VLSI and ULSI technology has placed additional demands on processing capabilities. The multi-level interconnect features that lie at the heart of this technology require careful processing of high aspect ratio features, such as vias, lines, contacts, interconnects, and other features. Reliable formation of these features is very important to VLSI and ULSI success and to the continued effort to increase circuit density and quality of individual substrates and die.

As circuit densities increase, the widths of vias, contacts and other features, as well as the dielectric materials between them, decrease to sub-micron dimensions, i.e., 0.25 $\mu$m or less, whereas the thickness of the dielectric layers remains substantially constant, with the result that the aspect ratios of the features, i.e., their height divided by width, increases. Many traditional deposition processes have difficulty filling sub-micron structures where the aspect ratio exceeds 4:1, and particularly where it exceeds 10:1. Therefore, there is a great amount of ongoing effort being directed at the formation of void-free, sub-micron features having high aspect ratios.

Conducting metals such as aluminum and copper are being used to fill sub-micron features on substrates during the manufacture of integrated circuits. However, aluminum and copper can diffuse into the structure of adjacent dielectric layers, thereby compromising the integrity of the devices being formed. Diffusion, as well as interlayer defects, such as layer delamination, may be prevented by depositing a liner layer, a barrier layer, or a combination of both, in a feature before depositing the conducting metal. The liner layer is conventionally composed of a refractory metal that provides good adhesion to the underlying material. The barrier layer is deposited on the liner layer or underlying material and is often a nitride of a refractory metal that prevents interlayer diffusion and minimizes chemical reactions between underlying materials and subsequently deposited materials.

With the recent progress in sub-quarter-micron copper interconnect technology, metals such as tantalum, niobium, tungsten, and the respective metal nitrides have become popular liner and barrier materials in copper applications. Depending on the application, a liner adhesion layer and/or a diffusion barrier layer may comprise a metal, such as tantalum, niobium, or tungsten, a metal nitride layer, such as tantalum nitride, niobium nitride layer, or tungsten nitride, a metal and metal nitride stack, or other combinations of diffusion barrier materials. Metal and metal nitride layers have been traditionally deposited by physical vapor deposition (PVD) techniques. However, traditional PVD techniques are not well suited for providing conformal coverage on the wall and bottom surfaces of high aspect ratio vias and other features. Therefore, as aspect ratios increase and device features shrink, new deposition techniques are being investigated to provide conformal coverage in these device features.

One proposed alternative to PVD deposition of metal and metal nitride layers is depositing the layers by chemical vapor deposition (CVD) techniques to provide good conformal coverage of substrate features. The ability to deposit conformal metal and metal nitride layers in high aspect ratio features by the disassociation of organometallic precursors has gained interest in recent years due to the development of metal organic chemical vapor deposition (MOCVD) techniques. In such techniques, an organometallic precursor comprising a metal component and organic component is introduced into a processing chamber and disassociates to deposit the metal component on a substrate while the organic portion of the precursor is exhausted from the chamber.

However, current MOCVD techniques deposit layers at near atmospheric conditions. Layers deposited at near atmospheric conditions generally have less than desirable coverage of sub-micron features formed on a substrate which can lead to void formation in substrate features and possible device failure. Additionally, atmospheric deposited layers generally have high levels of contaminants which detrimentally affect layer properties, such as layer resistivity, and produce layers with less than desirable interlayer bonding and diffusion resistance. Further, atmospheric layer deposition processes have been observed to deposit materials that flake or delaminate from the surfaces of the chamber or substrate and become a particle source within the chamber. Particles can produce layering defects in the deposited layers and result in less than desirable interlayer adhesion.

Additionally, there are few commercially available organometallic precursors for the deposition of metal layers, such as tantalum, niobium, and tungsten precursors by MOCVD techniques. The precursors that are available produce layers which have unacceptable levels of contaminants such as carbon and oxygen, and have less than desirable diffusion resistance, low thermal stability, and undesirable layer characteristics. Further, in some cases, the available precursors used to deposit metal nitride layers produce layers with high resistivity, and in some cases, produce layers that are insulative. The insulative properties of the layer are generally a result of the crystalline structure or the chemical composition of the materials deposited from the precursor. For example, in tantalum layers, as the nitrogen content increases, the layer becomes increasingly resistive. A high nitrogen content can transition a good conducting phase of tantalum nitride with superior barrier properties, such as $Ta_2N$, into an insulating phase, such as $Ta_3N_5$. Many of the available tantalum nitride precursors readily deposit an insulating $Ta_3N_5$ phase. Contaminants, such as carbon and hydrogen deposited from available precursors can also increase film resistivity. Furthermore, there are no current satisfactory MOCVD techniques and precursors for depositing materials, such as silicon, which can be incorporated in the deposited metal and metal nitride materials to improve diffusion resistance, chemical resistance, thermal stability, or enhance interlayer adhesion.

One additional problem with depositing metal liner layers and metal nitride barrier layers using current CVD deposition techniques is that often during substrate processing, it is required to transfer the substrate between processing chambers or systems in order to deposit both the metal layer and the metal nitride layer. The transfer of substrates between processing chambers and systems increases processing time and decreases substrate throughput while potentially exposing the layers to contamination or to atmospheric conditions where oxidation may occur.

Therefore, there remains a need for a process for forming liner and/or barrier layers of metal or metal nitride materials from organometallic precursors. Ideally, the liner and/or barrier layers deposited are substantially free of contaminants, have reduced layer resistivities, improved interlayer adhesion, improved diffusion resistance, and improved thermal stability than those produced with prior processes. Ideally, the metal and metal nitride layers are deposited at sub-atmospheric pressures.

SUMMARY OF THE INVENTION

The invention generally provides an organometallic precursor and a method of forming a metal or metal nitride layer on a substrate by chemical vapor deposition of the organometallic precursor. In one aspect of the invention, a precursor of the formula $(Cp(R)_n)_xM(CO)_{y-x}$ is used to deposit a metal or metal nitride layer at sub-atmospheric pressures. The method for depositing the metal or metal nitride layer comprises introducing the precursor into a processing chamber, preferably maintained at a pressure of less than about 20 Torr, and disassociating the precursor in the presence of a processing gas to deposit a metal or metal nitride layer. The precursor may be disassociated and deposited by a thermal or plasma-enhanced process. The method may further comprise a step of exposing the deposited layer to a plasma process to remove contaminants, density the layer, and reduce the layer's resistivity.

The precursor of the formula: $(Cp(R)_n)_xM(CO)_{y-x}$, comprises a metal, M, selected from the group of tantalum, niobium, vanadium, and tungsten, having a valence of y, at least one cyclopentadienyl functional group, Cp, which may form between 1 and 5 ligands, x, with the metal, M, and have between 0 and 5 substituents, n, which comprise an organic group, R, and at least one carbonyl group, CO, forming a ligand with the metal, M. The organic group, R, may further comprise one or more carbon silicon bonds, preferably comprising an alkylsilyl functional group. The alkyl silyl group may further include at least one silicon-oxygen bond.

Another aspect of the invention provides a method of depositing a metal layer and a metal nitride layer in situ. The method comprises depositing a metal layer by either a thermal or plasma-enhanced disassociation of a precursor of the formula $(Cp(R)_n)_xM(CO)_{y-x}$ in the presence of a processing gas, such as an inert gas, a reactive gas, or a combination of both, and depositing the metal nitride layer on the metal layer by the disassociation of a precursor of the formula $(Cp(R)_n)_xM(CO)_{y-x}$ in the presence of a nitrating processing gas, such as nitrogen ($N_2$) or ammonia ($NH_3$). The metal layer and the metal nitride layer may both be exposed to a plasma following deposition.

Another aspect of the invention provides a method for metallization of a feature on a substrate comprising depositing a dielectric layer on the substrate, etching a pattern into the substrate, depositing a metal layer on the substrate, depositing a metal nitride layer on the metal layer, and depositing a conductive metal layer on the metal nitride layer. The substrate may be optionally exposed to reactive pre-clean comprising a plasma of hydrogen and argon to remove oxide formations on the substrate prior to deposition of the metal nitride layer. The conductive metal is preferably copper and may be deposited by physical vapor deposition, chemical vapor deposition, or electrochemical deposition.

The metal layer and the metal nitride layer are deposited by the thermal or plasma enhanced disassociation of an organometallic precursor having the formula $(Cp(R)_n)_xM(CO)_{y-x}$ in the presence of a processing gas, preferably at a pressure less than about 20 Torr. Once deposited, the metal layer and the metal nitride layer are exposed to a plasma prior to subsequent layer deposition.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
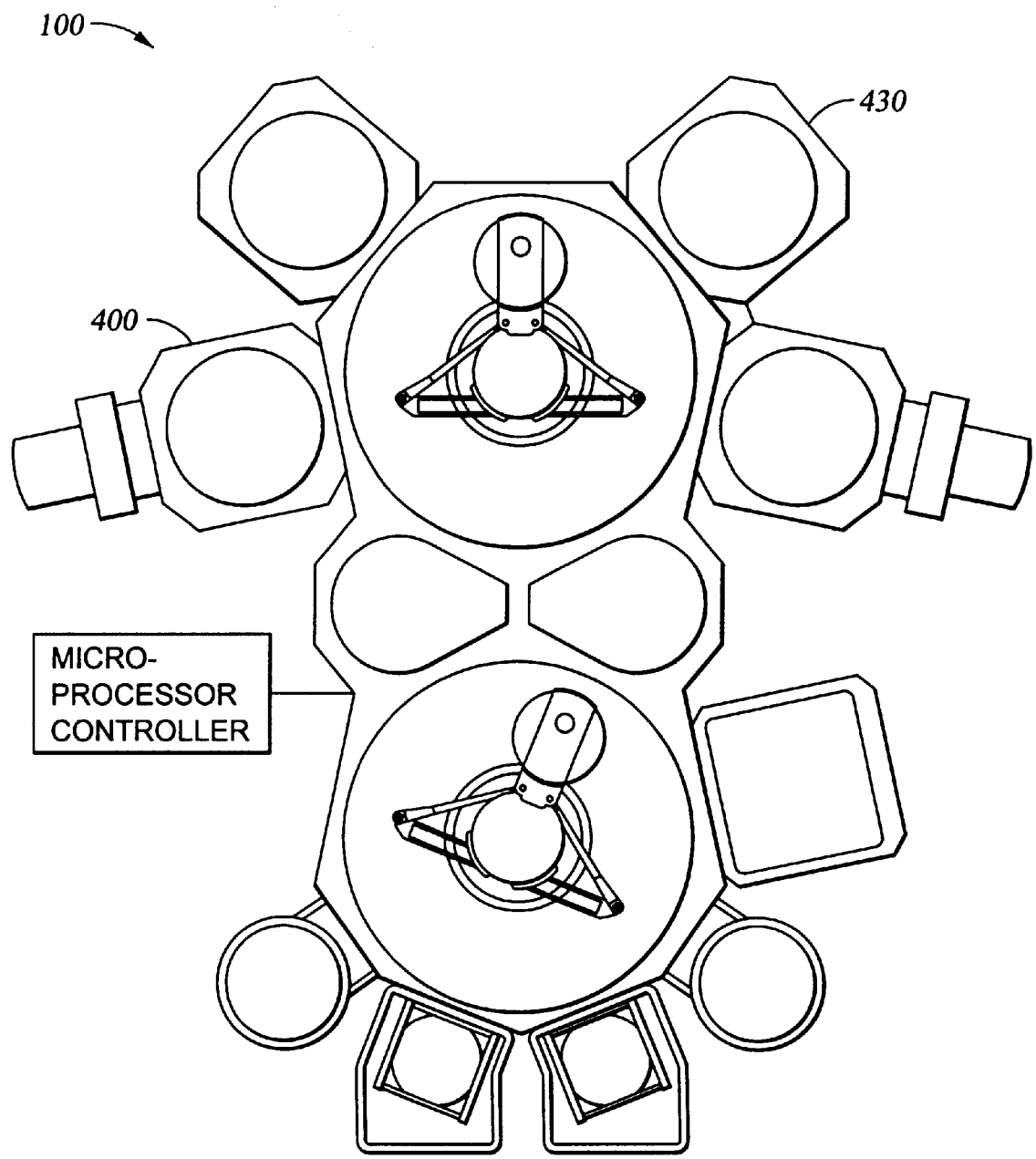
FIG. 1 is a schematic top view of one embodiment of an integrated multi-chamber apparatus for performing CVD and PVD processes on a substrate.

The invention generally provides an organometallic precursor and a method of processing a substrate, preferably at sub-atmospheric pressures below about 20 Torr to form a metal layer and/or metal nitride layer on the substrate by chemical vapor deposition (CVD) of the organometallic precursor. The metal or metal nitride layer is deposited on a heated substrate by thermal or plasma enhanced disassociation of the organometallic precursor having the formula $(Cp(R)_n)_xM(CO)_{y-x}$ in the presence of a processing gas. The processing gas may be an inert gas, such as helium and argon, or may include a reactant processing gas such as hydrogen, nitrogen, ammonia, silane, and combinations thereof. The composition of the processing gas is selected to deposit metal, metal silicide, metal nitride, and metal silicon nitride layers as desired.

The organometallic precursor, $(Cp(R)_n)_xM(CO)_{y-x}$, is a carbonyl organometallic precursor where M represents the metal to be deposited. Examples of metals which can be deposited according to this invention are tungsten and the Group VB metals of vanadium, tantalum, and niobium. Y is the valence of the metal, M, of the precursor, with a valence of 6 for tungsten, and a valence of 5 for the Group VB metals.

Cp is a cyclopentadienyl ring having the general formula ($C_5H_5$—) which forms a ligand with the metal, M. The cyclopentadienyl ring may be substituted with the substituted cyclopentadienyl ring represented by the formula, $(Cp(R)_n)_x$, where x is the number of cyclopentadienyl groups forming ligands with the metal, M. At least one, but generally between 1 and 5 cyclopentadienyl groups form a ligand with the metal, M, in forming the precursor. The precursor preferably contains one cyclopentadienyl group.

$(CO)_{y-x}$ represents the number of carbonyl groups, CO, in the precursor which form ligands with the metal, M. The number of carbonyl groups typically amount to the valence, y, of the metal, M, minus the number cyclopentadienyl groups, x, forming ligands with the metal M. The carbonyl groups form ligands with the metal complex to produce a vaporizable precursor which can be transported by a liquid delivery system and used in processing chambers capable of performing MOCVD processes. The carbonyl groups can easily disassociate from the metal by a thermal or plasma-enhanced process to deposit a layer of the metal, M, onto the surface of a substrate.

Referring to the substituted cyclopentadienyl ring formula $(Cp(R)_n)_x$, R is a hydrocarbon substituent group replacing one or more hydrogen atoms on the cyclopentadienyl ring, and n is the number of substituent groups disposed on the ring. The substituent group R is preferably an organic functional group. The number of substituent groups on the cyclopentadienyl ring, represented by n, can number up to 5 when the cyclopentadienyl ring forms a ligand with the metal, M, of the precursor.

For example, a precursor such as $(C_5H_5)Ta(CO)_4$, tetracarbonyltantalum (shown below), can be formed when n is 0, x is 1, M is tantalum, y is 5, and y–x is 4.

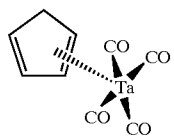

In one embodiment, the organic group comprises at least one carbon-silicon bond. Silane derived functional groups, such as alkylsilyl groups which include methylsilyl ($CH_3$)$SiH_2$—, dimethylsilyl $(CH_3)_2SiH$—, or trimethylsilyl $(CH_3)_3Si$—, are exemplary organic compounds having at least one carbon-silicon bond which can be substituted on the cyclopentadienyl rings of the precursor.

An organic group comprising at least one carbon-silicon bond may further comprise at least one silicon-oxygen bond. Silioxane groups are exemplary compounds comprising at least one carbon-silicon bond and at least one silicon-oxygen bond. In another embodiment, R is an inorganic substituent group which replaces one or more hydrogen atoms on the cyclopentadienyl ring. Silyl, $SiH_3$, and silyl derivative groups are exemplary inorganic compounds that may be used as the inorganic substituent group in forming the precursor.

In one embodiment, the hydrocarbon substituent groups are alkylsilyl groups, preferably having from 1 to 3 hydrocarbyl substituent groups. The hydrocarbyl substituent groups are defined as carbon containing organic functional groups, for example alkyl groups, such as methyl and ethyl, or alkenyl groups. Examples of exemplary alkylsilyl groups include methylsilyl ($CH_3$—$SiH_2$—), dimethylsilyl (($CH_3$)$_2$—SiH—), trimethylsilyl (($CH_3$)$_3$—Si—), and combinations thereof. Examples of other substituents of the cyclopentadienyl ring include the fluorinated derivatives of alkyl, alkenyl, or silicon containing substituents. Precursors such as $((Si(CH_3)_3)C_5H_4)Ta(CO)_4$, (trimethylsilylcyclopentadienyl) tetracarbonyltantalum (shown below), can be formed when R is trimethylsilyl, $(CH_3)_3Si$—, n is 1, x is 1, M is tantalum, y is 5, and y–x is 4.

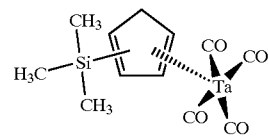

It is contemplated that the presence of the substituent groups on the cyclopentadienyl groups, particularly the silicon containing substituent groups, enhance preferred physical properties. It is contemplated that the substituent groups increase precursor volatility, decrease the temperature required to disassociate the precursor, and lower the boiling point of the organometallic precursor. An increased volatility of the precursor compounds ensures a sufficiently high concentration of precursor entrained in vaporized fluid flow to the processing chamber for effective deposition of a layer. The improved volatility will also allow the use of vaporization of the precursor by sublimation and delivery to a processing chamber without risk of premature disassociation. Additionally, the presence of substituent cyclopentadienyl groups may also provide sufficient solubility of the precursor for use in liquid delivery systems and in direct liquid injection systems.

It is contemplated that the precursors described herein have functional groups which allow the formation of heat decomposable organometallic compounds that are thermally stable at temperatures below about 150° C. and are capable of thermally disassociating at a temperature above about 150° C. The precursors are also capable of disassociation in a plasma generated by supplying a power density at about 0.6 Watts/cm$^2$ or greater, or at about 200 Watts or greater for a 200 mm substrate, to a processing chamber.

The organometallic precursors described herein may deposit metal, metal carbide, metal silicide, metal nitride, metal carbon nitride, or metal silicon nitride layers depending on the processing gas composition and the plasma gas composition for the deposition process. A metal layer is deposited in the presence of non-nitrating processing gases including an inert gas, such as argon, a reactant processing gas, such as hydrogen, and combinations thereof.

It is believed that the use of a reactant processing gas, such as hydrogen, facilitates reduction of the carbonyl groups from the precursor to form gases that can be exhausted from the chamber. The reactant processing gas also reacts with the cyclopentadienyl group to form volatile gases, thereby removing the cyclopentadienyl ring from the precursor and depositing a metal layer on the substrate. The metal layer is preferably deposited in the presence of argon. A silicon containing reactant processing gas, such as silane or silane derivatives, may be used in combination with the inert or reactant processing gases to deposit a metal silicide layer.

Metal nitride layers are deposited in the presence of a nitrating processing gas. Preferred nitrating gases are selected from the group of nitrogen, ammonia, a mixture of nitrogen and hydrogen, and combinations thereof. Silane and silane derivatives in combination with nitrating gases may also be used to deposit metal silicon nitride layers. Metal carbon nitride layers may be deposited by incomplete disassociation of the metal precursor or by foregoing a post deposition treatment plasma that removes carbon and hydrogen impurities formed in the deposited metal layer. Inert gases, such as argon and helium, may be used with nitrating processing gases to control the processing conditions during deposition of metal nitride layers to produce layers with desired nitrogen contents.

An exemplary processing regime for depositing a layer from the above described precursor is as follows. A precursor having the composition described herein, such as (trimethylsilylcyclopentadienyl) tetracarbonyltantalum, ((Si(CH$_3$)$_3$)C$_5$H$_4$)Ta(CO)$_4$, and a processing gas is introduced into a processing chamber. The precursor is introduced at a flow rate between about 5 and about 500 sccm and the processing gas is introduced into the chamber at a flow rate of between about 5 and about 500 sccm. In one embodiment of the deposition process, the precursor and processing gas are introduced at a molar ratio of about 1:1. The processing chamber is maintained at a pressure between about 100 milliTorr and about 20 Torr. The processing chamber is preferably maintained at a pressure between about 100 milliTorr and about 250 milliTorr. Flow rates and pressure conditions may vary for different makes, sizes, and models of the processing chambers used.

Thermal disassociation of the precursor involves heating the substrate to a temperature sufficiently high to cause the hydrocarbon portion of the volatile metal compound adjacent the substrate to disassociate to volatile hydrocarbons which desorb from the substrate while leaving the metal on the substrate. The exact temperature will depend upon the identity and chemical, thermal, and stability characteristics of the organometallic precursor and processing gases used under the deposition conditions. However, a temperature from about room temperature to about 1000° C. is contemplated for the thermal disassociation of the precursor described herein.

The thermal disassociation is preferably performed by heating the substrate to a temperature between about 100° C. and about 450° C. In one embodiment of the thermal disassociation process, the substrate temperature is maintained between about 250° C. and about 450° C. to ensure a complete reaction between the precursor and the reacting gas on the substrate surface. In another embodiment, the substrate is maintained at a temperature of about 400° C. during the thermal disassociation process.

For plasma-enhanced CVD deposition of the precursor, power to generate a plasma is then either capacitively or inductively coupled into the chamber to enhance disassociation of the precursor and increase reaction with any reactant gases present to deposit a layer on the substrate. A Power density between about 0.6 Watts/cm$^2$ and about 3.2 Watts/cm$^2$, or between about 200 and about 1000 Watts, with about 750 Watts most preferably used for a 200 mm substrate, is supplied to the chamber to generate the plasma.

After disassociation of the precursor and deposition of the material on the substrate, the deposited material may be exposed to a plasma treatment. The plasma comprises a reactant processing gas, such as hydrogen, an inert gas, such as argon, and combinations thereof. In the plasma-treatment process, power to generate a plasma is either capacitively or inductively coupled into the chamber to excite the processing gas into a plasma state to produce plasma specie, such as ions, which may react with the deposited material. The plasma is generated by supplying a power density between about 0.6 Watts/cm$^2$ and about 3.2 Watts/cm$^2$, or between about 200 and about 1000 Watts for a 200 mm substrate, to the processing chamber.

In one embodiment the plasma treatment comprises introducing a gas at a rate between about 5 sccm and about 300 sccm into a processing chamber and generating a plasma by providing power density between about 0.6 Watts/cm$^2$ and about 3.2 Watts/cm$^2$, or a power at between about 200 Watts and about 1000 Watts for a 200 mm substrate, maintaining the chamber pressure between about 50 milliTorr and about 20 Torr, and maintaining the substrate at a temperature of between about 100° C. and about 450° C. during the plasma process.

It is contemplated that the plasma treatment lowers the layer's resistivity, removes contaminants, such as carbon or excess hydrogen, and densifies the layer to enhance barrier and liner properties. It is believed that species from reactant gases, such as hydrogen species in the plasma react with the carbon impurities to produce volatile hydrocarbons that can easily desorb from the substrate surface and can be purged from the processing zone and processing chamber. Plasma species from inert gases, such as argon, further bombard the layer to remove resistive constituents to lower the layers resistivity and improve electrical conductivity.

The plasma process is also believed to density the layer and remove layering defects, thereby improving the deposited layer's diffusion resistance and interlayer adhesion. Additionally, it is further believed that the post deposition plasma will density material disposed at the bottom of substrate features in preference over material disposed on the sidewalls of the feature. This forms a more conductive layer at the bottom of the feature, at the contact point between different levels of the device, than on the sidewalls where the feature typically contacts insulator materials.

For metal and metal nitride layers, the plasma gas comprises argon, hydrogen, and combinations thereof, but most preferably argon. Metal nitride layers may also be exposed to plasma containing nitrating gases such as nitrogen, a mixture of hydrogen and nitrogen, ammonia, and combinations thereof. Nitrating plasmas can be used to treat nitride films to further displace contaminants, such as carbon and hydrogen from organic groups, and result in a more dense film. The plasma composition has been observed to affect the nitrogen content of the layer.

For example nitrating plasmas can increase the nitrogen content of the deposited layer resulting in a phase change of the deposited material which may change the properties of the deposited material. The increase nitrogen content can, in some materials, such as tantalum nitride, increase the resistivity of the layer, and in some cases produce an insulating phase, such as an insulating Ta$_3$N$_5$ phase. Non-nitrating plasma treatments, such as argon and hydrogen, are preferably used for nitrogen sensitive layers such as tantalum nitride. Therefore the composition of the plasma gas can be managed to control of the phase of the deposited metal nitride layer. Phase is broadly defined herein as the bonding or crystalline structure of a materials which can exhibit different properties while retaining the same material components. For example, two phases of tantalum nitride comprise Ta$_2$N, a good conducting phase with superior barrier properties, and Ta$_3$N$_5$ which is considered a good insulating phase.

Plasma treatments are preferably not performed for metal carbide and metal carbon nitride layers, since the plasma treatment may remove the desired carbon content of the layer. If a plasma treatment for a metal carbide or carbon nitride layer is performed, the plasma gases preferably comprise inert gases, such as argon and helium, to remove carbon.

In general, the effectiveness of the plasma treatment depends on the thickness of the untreated layer and plasma conditions. With a fixed plasma power and treatment time, the thinner the deposited layer, the more effective the treatment. The post-deposition plasma treatment has the further benefit of reducing temperature variations during sequential substrate depositions thereby eliminating the first wafer effect and maintaining a more stable processing regime. The deposition and plasma treatment of the deposited layer may be performed in situ, for example, in the same chamber or in the same system without breaking vacuum, or performed in different processing chambers.

It is believed that depositing layers from the above identified precursors and exposing the layers to a post deposition plasma process will produce a layer with improved material properties. The deposition and/or treatment of the materials described herein are believed to have improved diffusion resistance, improved interlayer adhesion, improved thermal stability, and improved interlayer bonding It is also contemplated that adhesive and barrier properties of the materials of the invention may be improved by incorporating silicon into the layer to form metal silicide and metal silicon nitride layers. It is contemplated that ternary layers, such as TaSiN, are very stable and allow minimal diffusion by silicon implantation in the grain boundaries of the nitride layer.

The Apparatus

Referring to FIG. 1, a schematic diagram of an exemplary integrated cluster tool 100 for performing the CVD deposition processes of the invention is shown. The methods described herein are preferably carried out in an integrated cluster tool that has been programmed to process a substrate accordingly. One exemplary apparatus for use with the processes of the invention is an "ENDURA" system commercially available from Applied Materials, Inc., Santa Clara, Calif. A similar staged-vacuum substrate processing system is disclosed in U.S. Pat. No. 5,186,718, entitled Staged-Vacuum Substrate Processing System and Method, Tepman et al., issued on Feb. 16, 1993, which is hereby incorporated herein by reference. The particular embodiment of the apparatus 100 shown herein is suitable for processing planar substrates, such as semiconductor substrates, and is provided to illustrate the invention, and should not be used to limit the scope of the invention. The apparatus 100 typically comprises a cluster of interconnected process chambers, for example, a chemical vapor deposition (CVD) chamber 430, and optionally, a physical vapor deposition PVD chamber 400.

The organometallic precursor is introduced into the processing chamber 430 by either a liquid delivery system or a precursor vaporizer system. The organometallic precursor of the invention may be a liquid or a solid. In a liquid state, the precursor is delivered to the processing chamber by a liquid delivery system, and in a solid state, the precursor is delivered to the processing chamber by a precursor vaporizer system, where the vaporizer provides heat to vaporize or sublime the precursor.

For processing in a liquid delivery system, precursors with high viscosities may be first dissolved in an aliphatic hydrocarbon solvent, such as hexane or octane, to reduce the viscosity of the liquid precursor. A solvent which has a vaporization temperature of about the same as the precursor is preferably used for dissolving and subsequently vaporizing the precursor. A molar ratio of 1:1 of precursor and solvent is preferably used for delivering precursor to a processing chamber as a vaporized fluid. The dissolved precursor and solvent are stored in an ampoule or storage container in the system until a pressurized inert gas supplied to the inert gas under pressure into the ampoule forces the precursor into a processing liquid path.

A liquid flow controller regulates the liquid precursor flow and the flow rate can be varied from 1 mg/min to 1000 mg/min, or any other amount needed for the deposition process. After flowing past the liquid flow controller, the precursor liquid is vaporized, similar to atomization, in a vaporizer and carried by an inert carrier gas stream, such as helium or argon, into the processing chamber, such as a CVD TxZ™ chamber available from Applied Materials of Santa Clara, Calif. The liquid delivery system vaporizer is often heated between about 50° C. and about 120° C. to facilitate the vaporization process.

Figure 2:
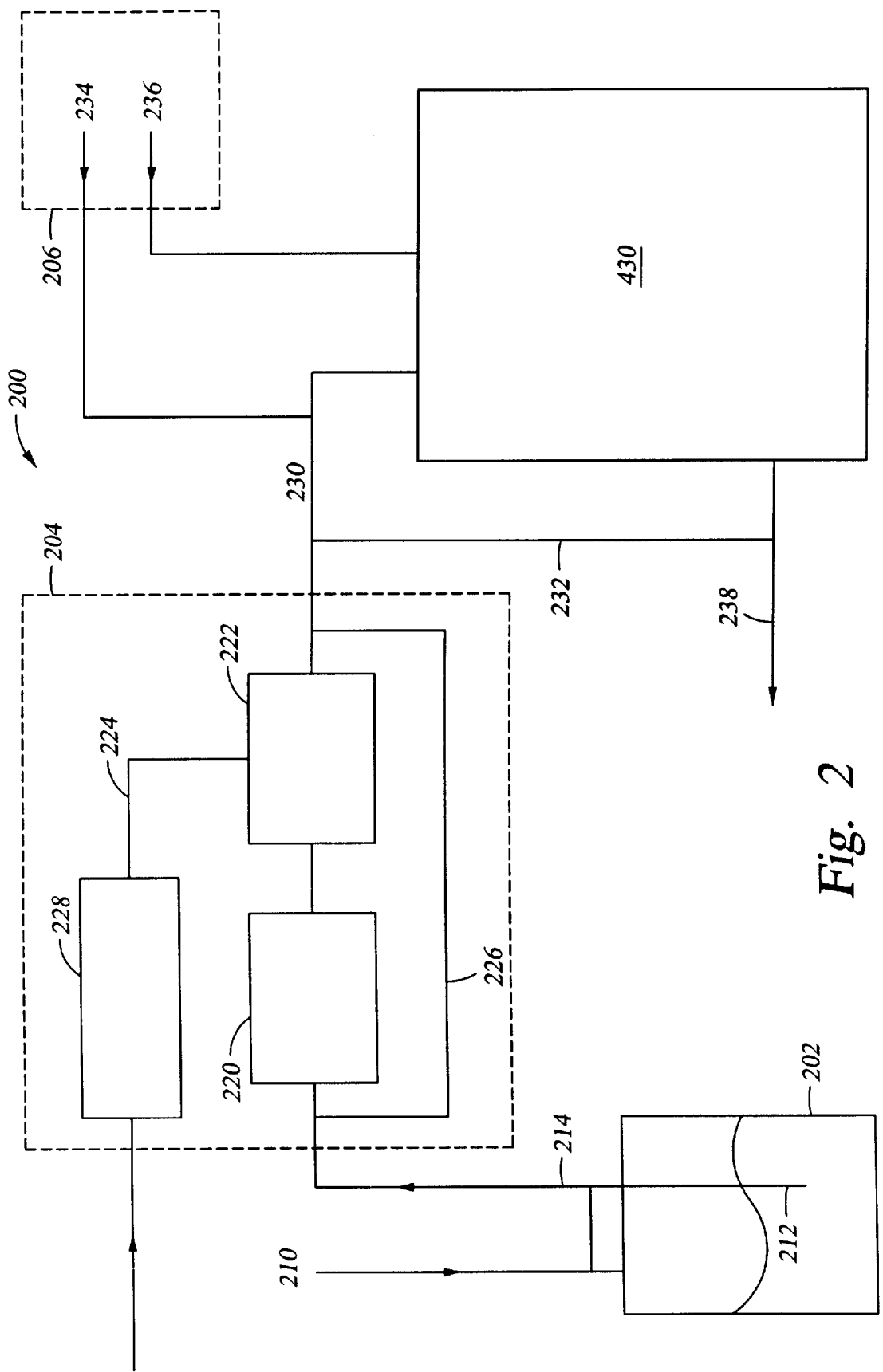
FIG. 2 is a schematic of one embodiment of a liquid delivery system.

FIG. 2 is a schematic view showing a liquid delivery system 200 for delivery of the precursor to the processing chamber 430. FIG. 2 is provided for illustrative purposes and should not be construed or interpreted as limiting the scope of the invention. The liquid delivery system generally includes a liquid precursor ampoule 202, a vaporizer module 204, a source of processing gas 206, such as a gas box, and a processing chamber 430. Additionally, valves are disposed along the length of the liquid delivery lines to control flow of liquid from the ampoule to the vaporizer and then the processing chamber 430 to prevent collection of precursor within the system which can negatively affect process stabilization and/or repeatability.

The ampoules are designed to deliver the liquid precursors at high pressure, e.g., up to 500 psi, without having to rely on high pressure pumps, i.e., no high cycle mechanical pump with rubbing parts exposed to precursors. To provide the pressure, an inert gas such as argon is charged into the ampoules at a pressure of between about 5 psi and about 90 psi through line 210. A liquid outlet line 212 is disposed in the ampoule so that as the inert gas, e.g., argon, is delivered to the ampoule and the appropriate valves are opened, the liquid is forced out through the outlet through a valve and into a liquid delivery line 214.

The delivery line 214 is connected from the ampoule 202 to the vaporizer module 204. The vaporizer module includes a liquid flow controller (LFC) 220, a vaporizer 222, and a carrier gas line 224. The liquid precursor delivery line 214 delivers the liquid precursor and solvent through the LFC 220 and into the vaporizer 222. The LFC 220 controls delivery of the liquid to the vaporizer 222 and measures the processing liquid flow rate from the delivery line 214 prior to entering the vaporizer 222.

In one embodiment, the vaporizer is a liquid injection valve capable of vaporizing, or atomizing, the precursor and solvent. The injection valve comprises a fluid inlet for receiving a pressurized processing liquid from the liquid precursor delivery line 214, a carrier gas inlet for receiving a carrier gas line 224, and an outlet line 230 for delivering a vaporized processing liquid/carrier gas mixture to a processing chamber 430. In operation, the carrier gas, such as argon, enters the injection valve, wherein the precursor liquid from the processing liquid flow line 214 is injected into the carrier gas. The vaporized liquid precursor/carrier gases leave the injection valve by the outlet line 230 for reaction in the process chamber 430. The injection valve is often heated so that when the processing liquid is injected into the carrier gas, the heat and the low partial vapor pressure of the processing liquid in the carrier gas causes the processing liquid to vaporize. In one embodiment, the carrier gas line heater 228 is disposed on the carrier gas line 224 to pre-heat the carrier gas to increase entrainment of the vaporized precursor in the carrier gas stream.

Carrier gases may also be introduced into the outlet line 230 via an auxiliary carrier gas line 234 prior to entering the processing chamber 430. The auxiliary carrier gas line 234 improves vaporization of the precursor and solvent by increasing entrainment of the vaporized liquid and providing heat to the gas line to reduce condensation of the vaporized liquid in the outlet line 230. A reactant processing gas line 236 provides for the introduction of reactant gases, such as hydrogen or ammonia, into the processing chamber 430 for interaction with the precursors and deposition of metal layers. A bypass line 232 is in fluid communication with the outlet line 230 and exhaust pump line 238 allows delivery of liquid precursor for disposal or recycle when the processing chamber 430 is not depositing a metal layer, such as during substrate transfer. Another bypass line 226 couples the liquid precursor delivery line 214 to the outlet line 230.

Figure 3A:
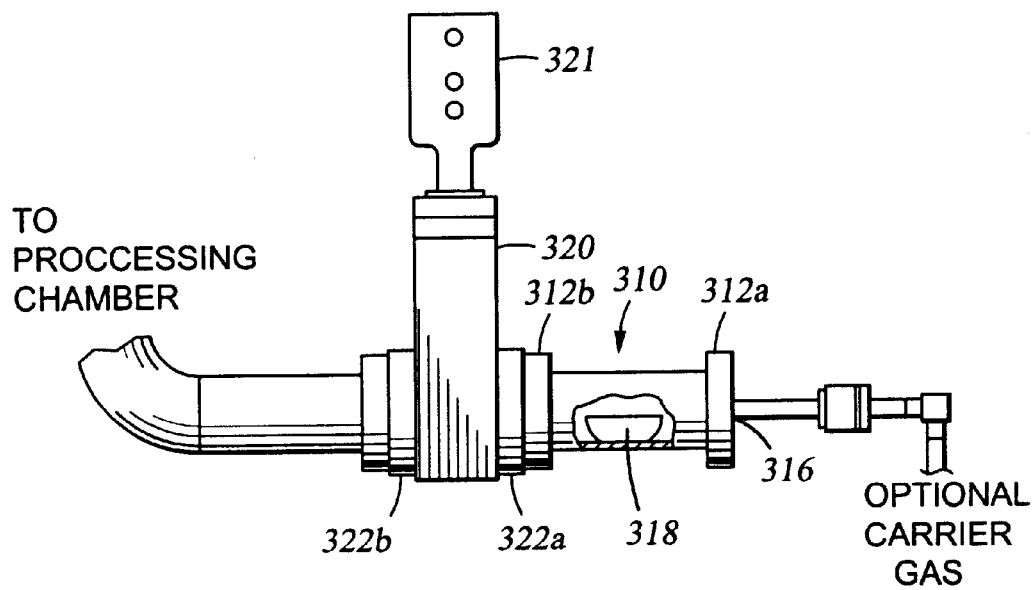
FIG. 3A is a partially sectioned view of one embodiment of a precursor vaporization apparatus.
Figure 3B:
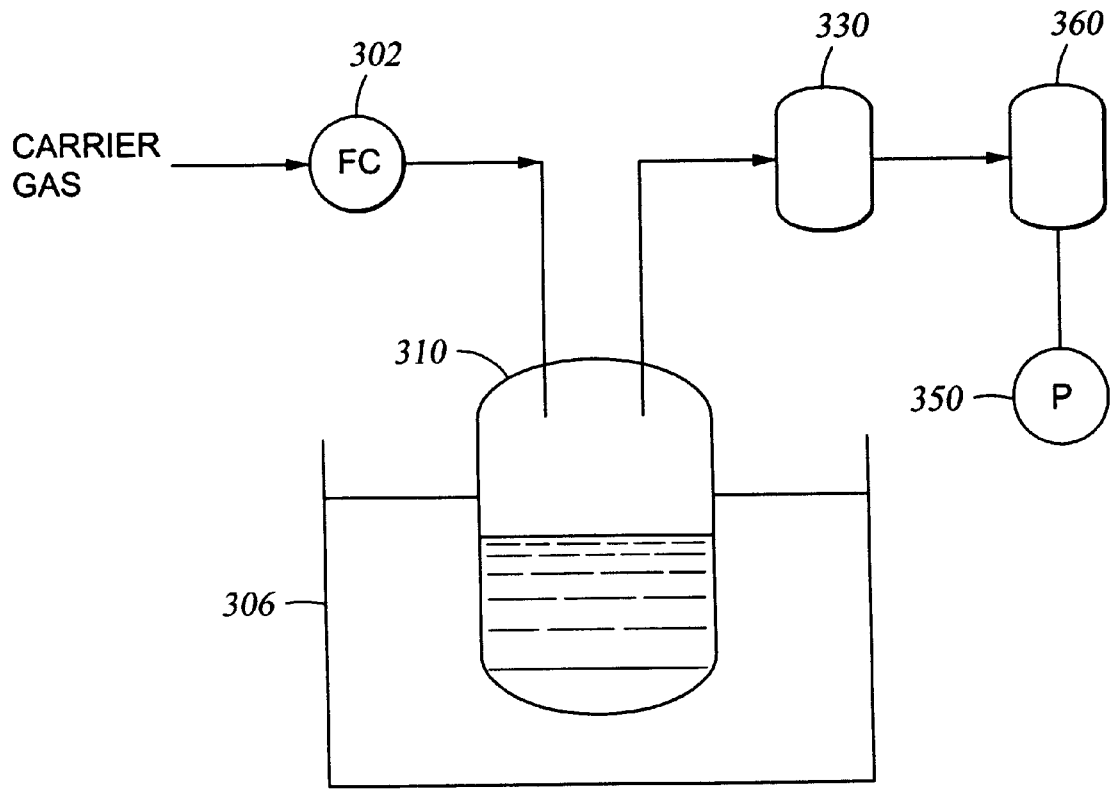
FIG. 3B is a schematic view of one embodiment of a carrier gas delivery system for transporting a precursor material from a vaporizer to a deposition chamber.

FIG. 3A shows a precursor vaporizer system, where a vaporizer 310 is provided to heat and vaporize or sublime the precursor. FIG. 3A and 3B are provided for illustrative purposes and should not be construed or interpreted as limiting the scope of the invention. The vaporizer 310 generally comprises a metal cylinder of stainless steel or aluminum having flanges 312a–b at either end. A heated pressure gauge (not shown) is located in the vaporizer to monitor the pressure of the vaporizer to insure that a continuous feed of particulate solid or liquid precursor is provided to the vaporizer 310. The pressure gauge is preferably heated so that material will not deposit or disassociate on the gauge and render the gauge inoperable. One suitable precursor vaporizer system for solid precursors useful with the invention described herein is the MKS 1153 from Applied Materials, Inc., of Santa Clara, Calif. The following vaporizer description is illustrative and should not be construed or interpreted as limiting the scope of the invention.

One embodiment of a vaporization chamber or vaporizer 310 is shown heating the starting material to vaporize or sublime a liquid or solid precursor material before introducing it into the deposition chamber or blending it with another precursor. A gas inlet port 316 permits the flow of a non-reactive gas into vaporizer 310. A gate valve 320 disposed between flanges 322a and 322b separates the vaporizer 310 from the processing chamber (not shown). In one embodiment, the gate valve 320 may be adjusted (i.e., opened and closed) by actuating a valve member 321. Within vaporizer 310, as shown in FIG. 3A, is a containment vessel 318 for placement of the precursor. The containment vessel 318, which may rest on the inner surface of the vaporizer 310, is made of a non-reactive material, usually a ceramic material, and preferably comprises quartz. In another embodiment, an inert gas may be bubbled (not shown) through a containment vessels containing the precursor, and any solvents if needed, to enhance vaporization of the precursors of the invention.

The pressure in vaporizer 310 may be maintained at atmospheric pressure, but for the chemical vapor deposition process, the pressure is preferably maintained from between about 30 milliTorr and about 20 Torr, or any pressure used by the CVD processing chamber for deposition of the precursor. The increase in total pressure up to 20 Torr increases the deposition rate of the precursor and allows better control of the amount of precursor that is provided to the deposition chamber. The carrier gas can be any inert gas, preferably helium or argon, and most preferably argon.

The temperature of vaporizer 310, when operated within the previously described pressure ranges, will usually vary from a minimum temperature below which the material will not vaporize, at the pressure required for deposition, up to a maximum temperature below the temperature at which the vaporized material will disassociate, at the operative pressure. The substituent groups on the precursor have a strong influence on the boiling point and disassociation temperature of the precursor, which provides for operating temperature that reflect the disassociation temperatures of the individual precursors. While the operating temperature of the vaporizer will vary according to the material to be vaporized, the temperature is preferably maintained between about 50° C. and about 200° C.

An alternative embodiment for the vaporizer 310 is shown in FIG. 3B where a thermostatic oven 306 heats the vaporizer 310 which contains, for example, non-vaporized and vaporized precursor. The carrier gas is passed through a flow controller 302 such as a metering pump or a needle valve and is bubbled through the non-vaporized precursor in the vaporizer 310. The vaporized liquid is provided from the vaporizer 310 to a decomposition chamber 330 and, subsequently, to the processing chamber 360 under the influence of a pressure differential established (at least in part) by a roughing pump 350. A mass flow meter (not shown) can be placed anywhere between the vaporizer 310 and the deposition chamber to measure the total mass leaving the vaporizer 310. The flow rate of precursor can then be calculated by subtracting the mass of carrier gas sent to the vaporizer 310 from the mass of material leaving the vaporizer 310.

Figure 4:
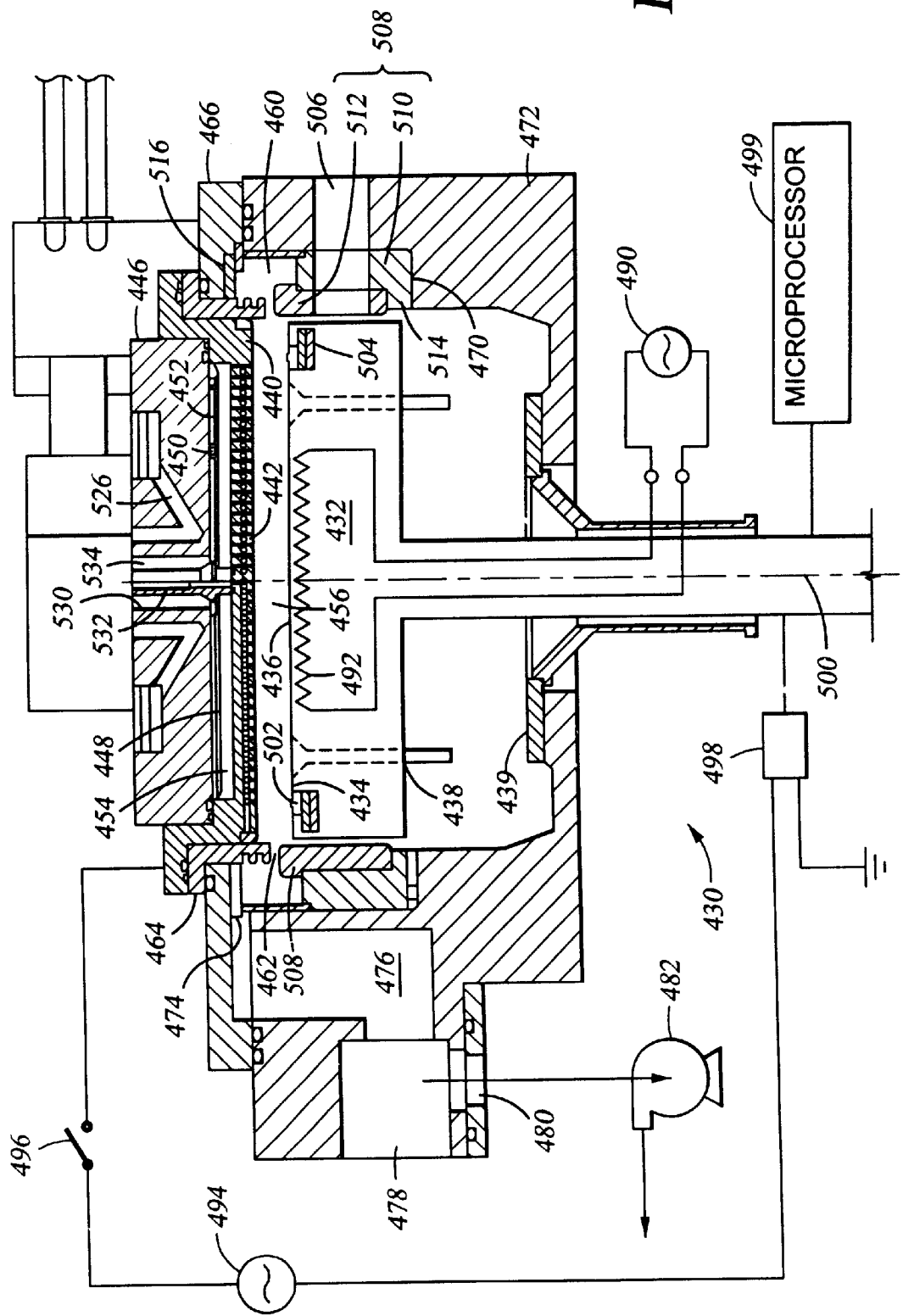
FIG. 4 is a schematic cross-sectional view of one embodiment of a CVD chamber for performing the CVD deposition processes of the invention.

Referring to FIG. 4, a schematic cross-sectional view of a CVD plasma for performing the processes of the invention is shown. The methods of the described herein are preferably carried out in a processing chamber that has been programmed to process a substrate accordingly. A preferred CVD chamber is known as the CVD TxZ chamber and is available commercially from Applied Materials, Inc., of Santa Clara, Calif. The CVD TxZ chamber is capable of depositing an organometallic precursor described herein in the presence of a processing gas for depositing a metal and/or metal nitride layer by either the thermal or plasma enhanced disassociation process.

In a preferred embodiment of the processing chamber, a dual manifold distributor, or showerhead 440, provides for the introduction of the precursor and of the reactant processing gases to the processing zone. An exemplary dual manifold showerhead is shown in U.S. patent application Ser. No. 09/207,780, entitled "Dual Channel Gas Distribution Plate", filed on Dec. 9, 1998, which is assigned to common assignee and incorporated herein by reference.

In the thermal or heat disassociation deposition process, an organometallic precursor gas described herein, is injected into the chamber through the showerhead 440 at a preferable pressure from between about 100 milliTorr and about 20 Torr while the pedestal 432 holds the substrate 436 at an elevated temperature above the disassociation temperature of the organometallic precursor of between about 100° C. and about 450° C., preferably from between about 250° C. and about 450° C. The reactant processing gas is introduced into the system through a second manifold in the shower head 440 to a volume located directly above the substrate and facilitates deposition of the layer. Thereby, a metal and/or metal nitride layer is conformally deposited on the substrate 436 in a CVD process. The disassociation process is a thermal process not usually relying upon plasma excitation of the precursor gas. If a plasma is desired during the deposition process or as a post deposition plasma treatment to remove impurities and densify the layer, sufficient voltage and power is applied by the RF source 494 to cause the process gas in the processing region 456 between the showerhead 440 and the pedestal 432 to discharge and to form a plasma.

The CVD chamber 430 includes a pedestal 432 supporting a substrate 436 on a supporting surface 434 to be deposited by CVD with a layer of material, such as a TaN layer. Lift pins 438 are slidable within the pedestal 432 but are kept from falling out by conical heads on their upper ends. The lower ends of the lift pins 438 are engageable with vertically movable lifting ring 439 and thus can be lifted above the surface 434 of the pedestal 432. The surface 434 has a smaller diameter than that of the substrate 436 resting thereon. With pedestal 432 in a lower loading position (slightly lower than a slit valve identified as "506" below), a robot blade (not shown) in cooperation with the lift pins 438 and the lifting ring 439 transfers the substrate 436 in and out of the chamber 430 through the slit valve 506, which can be vacuum-sealed to prevent the flow of gas into or out of the chamber through slit valve 506. Lift pins 438 raise an inserted substrate 436 off the robot blade, and then the pedestal 432 rises to transfer the substrate 436 the lift pins 438 onto the supporting surface 434 of the pedestal 432. A suitable robotics transfer assembly is described in commonly-assigned U.S. Pat. No. 4,951,601, issued to Maydan, the complete disclosure of which is incorporated herein by reference.

The process gas is injected into the reactor 430 through a central gas inlet 530 in a gas-feed cover plate 446 houses a coaxially disposed gas delivery conduit 532. The conduit 532 channels a second gas into the processing region 454, which is received at a lower end of the conduit 532, and delivers a gas to the second gas pathway (not shown), which includes the second set of horizontal channels. The central bore 530 and the outer perimeter of the conduit 532 define a gas delivery passage 534, such as an annulus, which delivers a gas above the perforated blocker plate 452 to a first disk-shaped space or region 448 and from thence through passageways 450 in a baffle plate (or a gas blocker plate) 452 to a second disk-shaped space or region 454 in back of the showerhead 440. The showerhead 440 includes a large number of holes or passageways 442 for jetting the process gases into a processing region or zone 456. More specifically, process gas passes from the space or void 454, through the passageways 442 and into the processing space or zone 456 and towards the substrate 436.

The process gas is injected into the reactor 430 through a central gas inlet 530 in a gas-feed cover plate 446 which houses a coaxially disposed gas delivery conduit 532. The conduit 532 channels a second gas into the processing region 454, which is received at a lower end of the conduit 532, and delivers a gas to the second gas pathway (not shown), which includes the second set of horizontal channels. The central bore 530 and the outer perimeter of the conduit 532 define a gas delivery passage 534, such as an annulus, which delivers a gas above the perforated blocker plate 452 to a first disk-shaped space or region 448 and from thence through passageways 450 in a baffle plate (or a gas blocker plate) 452 to a second disk-shaped space or region 454 in back of the showerhead 440. The showerhead 440 includes a large number of holes or passageways 442 for jetting the process gases into a processing region or zone 456. More specifically, process gas passes from the space or void 454, through the passageways 442 and into the processing space or zone 456 and towards the substrate 436.

Condensation of the precursor and processing gases on the showerhead can be prevented by coupling the showerhead to the heater. The showerhead is generally maintained at a temperature of between about 100° C. and about 180° C. to prevent precursor condensation and precursor disassociation on the showerhead. Condensation or deposition of the precursors on the showerhead can interfere with the deposition of the precursor and processing gas delivery and detrimentally affect the quality of the deposited layer. In one embodiment, the showerhead 440 is not coupled to a heater, but rather is position near a heater disposed in the substrate support to provide sufficient heating to avoid condensation on the showerhead 440.

Illustratively, temperature control may also be achieved by the provision of a channel 526 in the gas-feed cover plate 446.

The pumping channel 460 is connected through a constricted exhaust aperture 462 to a pumping plenum 476, and a valve 478 gates the exhaust through an exhaust vent 480 to a vacuum pump 482. The restricted choke aperture 462 creates a nearly uniform pressure around the circumferential pumping channel 460. The process gas and its reaction byproducts flow from the center of the showerhead 440 across the substrate 436 and the periphery of the pedestal 432 and then through the choke aperture 462 to the pumping channel 460. The gas then flows circumferentially in the pumping channel 460 to the exhaust aperture 474 and then through the exhaust plenum 476 and the exhaust vent 480 to the vacuum pump 482. Because of the restriction 462 the gas flow across the substrate 436 is nearly uniform in the azimuthal direction.

As shown in FIG. 4, the ledge 470 in the chamber body 472 supports an insulating annular chamber insert 508 composed of a insulating chamber ring 510 and a band shield 512, which forms the bottom of the pumping channel 460. The chamber lid rim 466 forms the top and part of the outside wall of the pumping channel 460 along with the part of the chamber body 472. The inside upper edge of the pumping channel 460 is formed by the isolator ring 464, which is made of a ceramic or other electrically insulating material which insulates the metallic showerhead 440 from the chamber body 472.

The CVD reactor 430 of FIG. 4 can be operated in two modes, thermal and plasma-enhanced. In the thermal mode, an electrical power source 490 supplies power to a resistive heater 492 at the top of the pedestal 432 to thereby heat the pedestal 432 and thus the substrate 436 to an elevated temperature sufficient to thermally activate the CVD deposition reaction. In the plasma-enhanced mode, an RF electrical source 494 is passed by a switch 496 to the metallic showerhead 440, which thus acts as an electrode. The showerhead 440 is electrically insulated from the lid rim 466 and the main chamber body 472 by the annular isolator ring 464, typically formed of an electrically non-conductive ceramic. The pedestal 432 is connected to a biasing element 498 associated with the RF source 494 so that RF power is split between the showerhead 440 and the pedestal 432. Sufficient voltage and power is applied by the RF source 494 to cause the process gas in the processing region 456 between the showerhead 440 and the pedestal 432 to discharge and to form a plasma. A microprocessor controller 499 is provided to monitor and control the deposition processes performed in the chamber 430.

The generally illustrated chamber insert 508 includes an L-shaped insulating ceramic ring 510 resting on the inside ledge 470 of the main chamber body 472 and also includes an annular or band shield 512 resting on an inside ledge 514 on the L-shaped ring 510 and spaced from the pedestal 432 and the centering ring 502 by a small gap. Ceramic chamber liners of themselves are well known, for example, as described by Robertson et al. in U.S. Pat. No. 5,366,585 incorporated herein by reference thereto. The band shield 512 is preferably made of a metal, such as aluminum, and extends vertically upwardly substantially above the top of the L-shaped ceramic ring 510 and to a lesser extent above the supporting surface 434 of the pedestal 432.

The lid liner 516 is metallic and is both thermally and electrically connected to the lid rim 466, effectively forming an extension of it, and because of its remote location does not easily affect the plasma in the processing region 456. Any metal depositing on the lid liner 516 will not further affect the plasma as long as the metal does not extend over the isolator ring 464. In any case, the lid liner 516 is easily removed by means of a fastener (not shown) when it becomes excessively coated.

The centering ring 502 performs two functions. It acts to precisely center the substrate 436 on the pedestal 432, the substrate 436 having been transferred into the chamber and onto the pedestal 432 by a robot blade (not shown) moving through the slit valve 506. This function blends with a retaining function in which the peripheral centering ring 502 acts as a retaining ring to told the substrate 536 within its opening. Additionally, the centering ring 502 acts as a thermal blanket for the portion of the pedestal 432 exposed outside of the substrate 436. Specifically, its thermal characteristics are designed in view of the intended process so that the centering ring 502 thermally floats relative to the heated pedestal 432 and remains relatively cool compared to the substrate 436 and significantly cooler than the underlying pedestal 432, and thus little material is deposited on it during thermal CVD processing.

Figure 5:
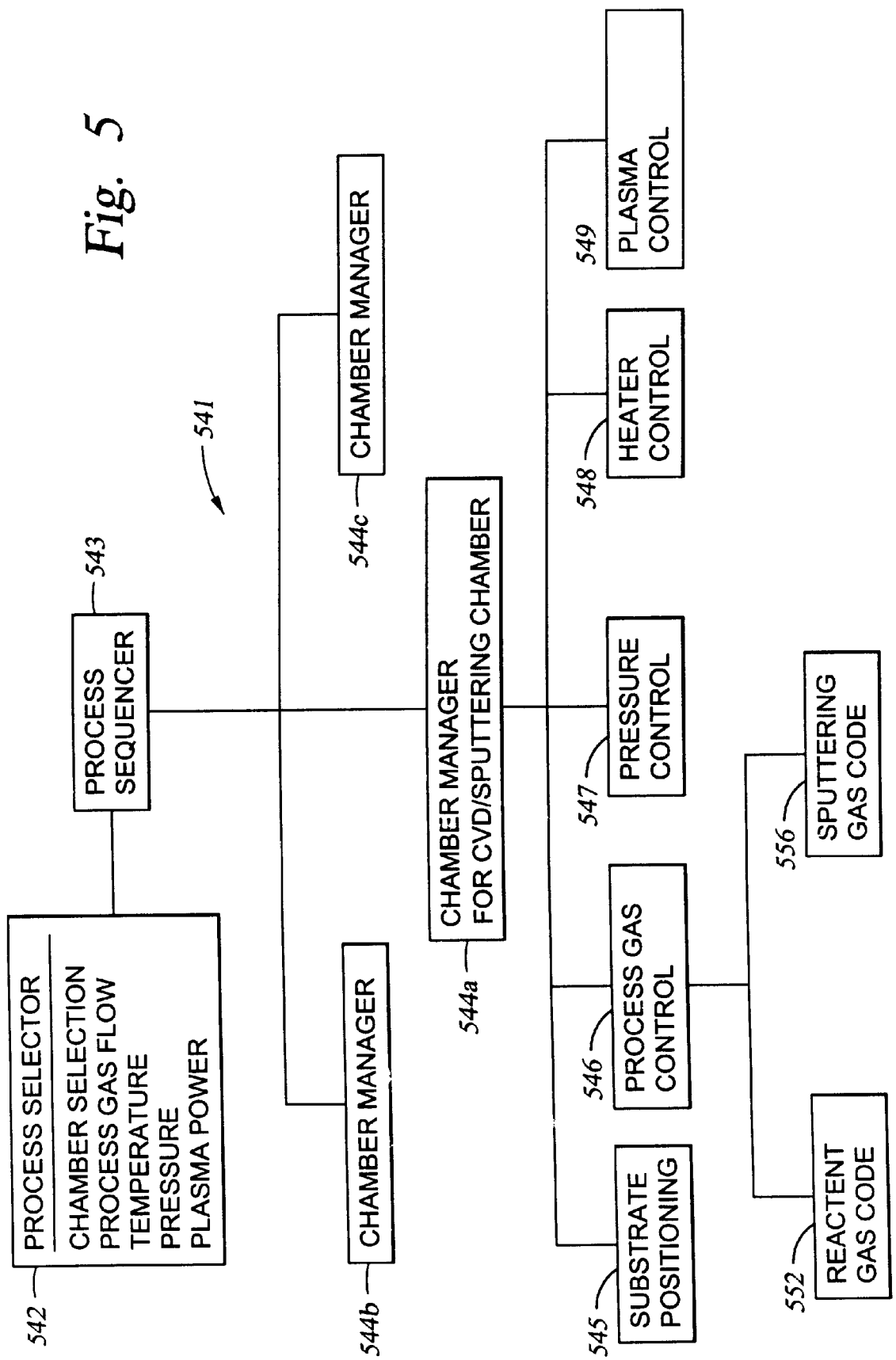
FIG. 5 is a simplified block diagram showing the hierarchical control structure of one embodiment of a computer program of the invention.

FIG. 5 shows an illustrative block diagram of the hierarchical control structure of the computer program 541 of the microprocessor controller 499. A user enters a process set number and process chamber number into a process selector subroutine 542 in response to menus or screens displayed on the CRT monitor by using the light pen interface. Tile process sets are predetermined sets of process parameters necessary to carry out specified processes, and are identified by predefined set numbers. Process selector subroutine 542 identifies (i) the desired process chamber in a multi-chamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing a light pen/CRT monitor interface (not shown).

A process sequencer subroutine 543 comprises program code for accepting the identified process chamber and set of process parameters from the process selector subroutine 542, and for controlling operation of the various process chambers. Multiple users can enter process set numbers and process chamber numbers, or a user can enter multiple process set numbers and process chamber numbers, so the sequencer subroutine 543 operates to schedule the selected processes in the desired sequence. Preferably the sequencer subroutine 543 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 543 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 543 determines which process chamber and process set combination is going to be executed next, sequencer subroutine 543 causes execution of the process set by passing the particular process set parameters to a chamber manager subroutine 544A–C, which controls multiple processing tasks in CVD chamber 430 and possibly other chambers (not shown) according to tile process set determined by sequencer subroutine 543.

Once the sequencer subroutine 543 determines which process chamber and process set combination is going to be executed next, the sequencer subroutine 543 causes execution of the process set by passing the particular process set parameters to the chamber manager subroutines 544A–C which control multiple processing tasks in different process chambers according to the process set determined by the sequencer subroutine 543. For example, the chamber manager subroutine 544A comprises program code for controlling CVD process operations, within the described process chamber 430 of FIG. 4.

The chamber manager subroutine 544 also controls execution of various chamber component subroutines or program code modules, which control operation of the chamber components necessary to carry out the selected process set. Examples of chamber component subroutines are substrate positioning subroutine 545, process gas control subroutine 546, pressure control subroutine 547, heater control subroutine 548, and plasma control subroutine 549. The process gas control subroutine 546 invokes one of reactant gas code 552 and sputtering gas code 556, depending upon the particular process being performed. Those having ordinary skill in the art will recognize that other chamber control subroutines can be included depending on what processes are desired to be performed in chamber 430 (shown in FIG. 4). In operation, chamber manager subroutine 544A selectively schedules or calls the process component subroutines in accordance with the particular process set being executed. Scheduling by chamber manager subroutine 544A is performed in a manner similar to that used by sequencer subroutine 543 in scheduling which process chamber and process set to execute. Typically, chamber manager subroutine 544A includes steps of monitoring the various chamber components, determining which components need to be operated based on the process parameters for the process set to be executed, and causing execution of a chamber component subroutine responsive to the monitoring and determining steps.

The Deposition Processes

Figure 6:
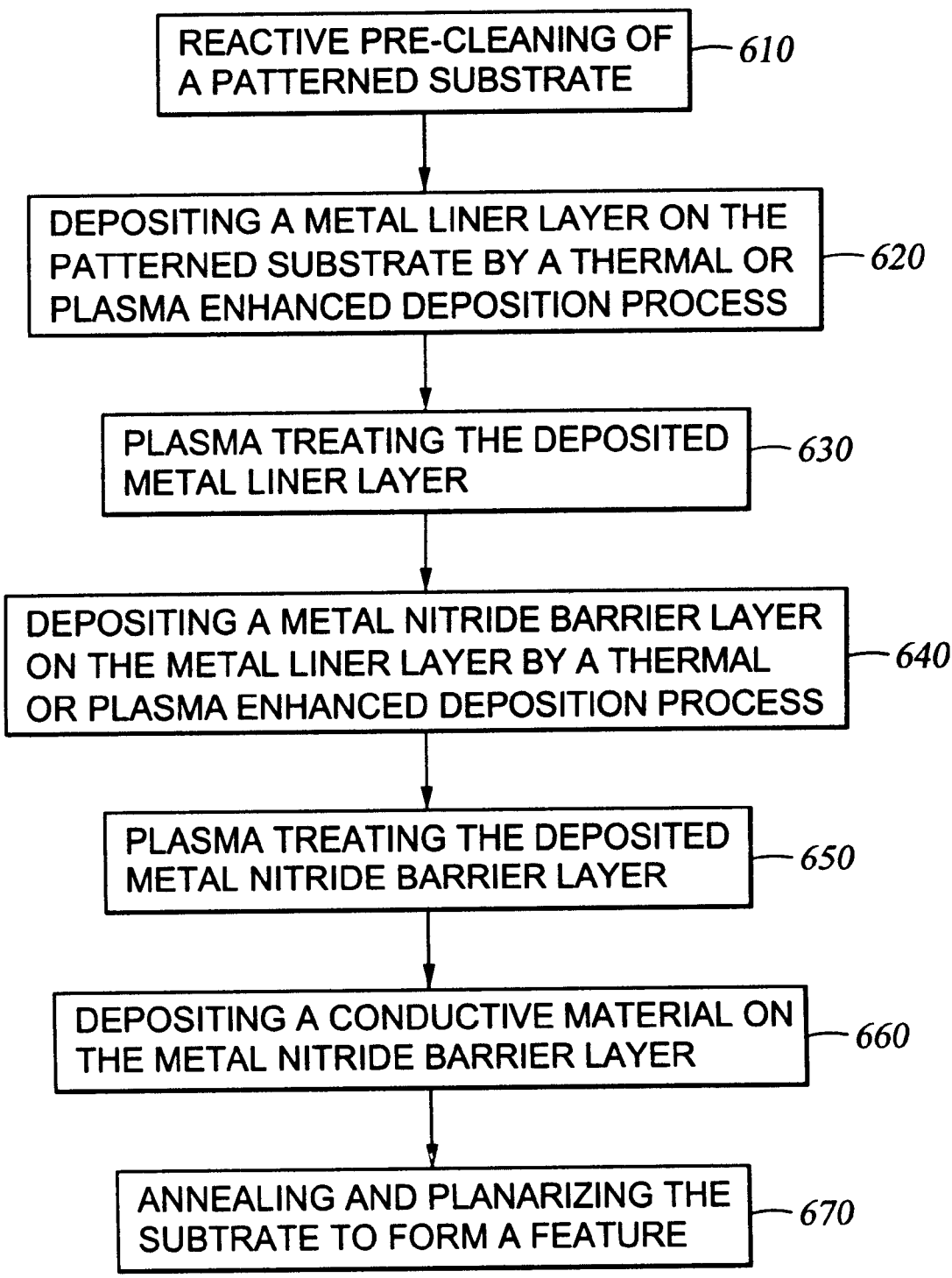
FIG. 6 is a flow chart illustrating steps undertaken in depositing metal and metal nitride layers according to one embodiment of the invention.

Referring to FIG. 6, the invention may be used to advantage in one embodiment of a sequential deposition process to form a metal/metal nitride liner/barrier stack for a conductive material metallization scheme. The following process is provided for illustrative purposes and should not be construed or interpreted as limiting the scope of the invention.

In an integrated liner/barrier metallization scheme of the invention, a patterned substrate having apertures formed therein is exposed to a reactive pre-clean process 610, generally using a plasma of hydrogen and argon, to remove oxides and other contaminants from the surface of the patterned substrate prior to deposition of the metal layer or metal nitride layer. A metal liner layer is conformally deposited 620 on the patterned substrate by a thermal or plasma-enhanced chemical vapor deposition (CVD) process from the disassociation of an organometallic precursor having the formula $(Cp(R)_n)_xM(CO)_{y-x}$ in the presence of a processing gas. In one embodiment, the metal liner layer is deposited from the precursor at a chamber pressure of less than about 20 Torr. The deposited metal layer is then plasma treated 630 to remove impurities and densify the layer.

A metal nitride barrier layer is then deposited 640 on the metal liner layer by a thermal or plasma-enhanced CVD process from the disassociation of an organometallic precursor having the formula $(Cp(R)_n)_xM(CO)_{y-x}$ in the presence of a nitrating processing gas. In one embodiment, the metal liner layer is deposited from the precursor at a chamber pressure of less than about 20 Torr. The deposited metal nitride layer is then plasma treated 650 to remove impurities and density the layer. A conductive metal layer is deposited 660 on the metal nitride layer to fill the aperture. The conductive metal is preferably copper and may be deposited by physical vapor deposition, chemical vapor deposition, or electrochemical deposition, preferably by an electroplating or electroless deposition process. The substrate may then be annealed and planarized 670, preferably by chemical mechanical polishing (CMP) process, to form a feature in the substrate. Preferably the metal/metal nitride liner/barrier stack is deposited from the same precursor in the same processing chamber.

While the following description detailed below refers to a tantalum and/or tantalum nitride liner and barrier scheme, other metals such as tungsten, vanadium, and niobium may be used with this process, and other processing regimes, such as the inclusion of nitrating plasma regimes, may be used with this process.

FIGS. 7A–7E further illustrate the process of one embodiment of the invention described herein. Referring to FIGS. 7A–7E, generally, an aperture 716 is formed in a dielectric layer 714 on a substrate 712, the substrate 712 is exposed to a reactive pre-clean, a liner layer 718 is deposited on the substrate 712 and in the aperture 716, a barrier layer 719 is deposited on the liner layer 718, and then a conducting metal layer 720 is deposited on the barrier layer 719 to fill the aperture 716. The substrate 712 may further be annealed and then planarized using a chemical mechanical polishing process.

Figure 7A:
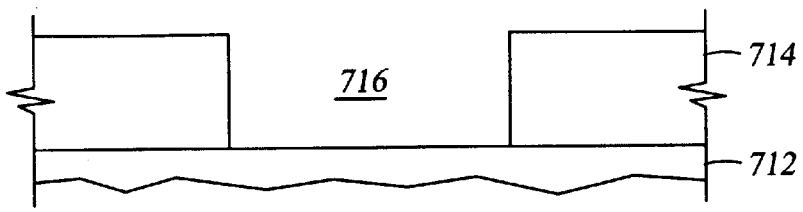
FIGS. 7A–7E are schematic diagrams of one embodiment of a process for metallizating a feature.

Referring to FIG. 7A, the aperture 716 is formed by depositing and pattern etching a dielectric layer 714 on the substrate 712. The term "aperture" is broadly defined in accordance with its customary usage in the semi-conductor industry, and is more particularly defined herein as a substrate structure formed in the substrate material or materials deposited on the substrate, and includes, but is not limited to, such substrate structures as trenches, lines, vias, contacts, interconnects, and dual damascenes.

The substrate 712, typically comprises a doped silicon substrate or a material such as glass, thermal oxides, quartz, and other materials conventionally used in semi-conductor fabrication. The substrate 712 may also comprise a patterned substrate having dielectric layers, such as silicon, and conductive layers, such as aluminum and copper, which can include a series of underlying layers and interconnects of various materials.

The substrate 712 is introduced into a processing chamber and a dielectric layer 714 is deposited thereon. The dielectric layer 714 can be a pre-metal dielectric layer deposited over the substrate or an inter-level dielectric layer. The dielectric layer 714 may be of any dielectric material, whether presently known or yet to be discovered, and is within the scope of the invention known in the art. The dielectric layer 714 may be deposited by conventional methods known in the art, such as by chemical vapor deposition (CVD) techniques. The dielectric layer 714 may be etched with any dielectric etching or patterning process known in the art, including plasma etching.

Prior to depositing the liner or barrier layers of the invention, oxides, which may interfere with subsequent layer deposition, and other contaminants on the surface of the substrate are removed by exposing the substrate surface to a reactive pre-clean process. The reactive pre-clean process comprises exposing the substrate surface to a plasma, preferably comprising hydrogen and an inert gas, such as argon, generated by supplying a power density between about 0.03 watts/cm$^2$ and about 3.2 Watts/cm$^2$, or at a power level between about 10 Watts and about 1000 Watts for a 200 mm substrate, to the processing chamber.

The reactive pre-clean process described herein may also be used to remove oxides formed on the liner layer 718 or the barrier layer 719 prior to deposition of subsequent layers. While one embodiment of a reactive pre-clean is described herein, the invention contemplates other oxide removal processes and substrate surface pre-cleaning processes, such as nitrogen reduction of oxide formations on metal layers.

Figure 7B:
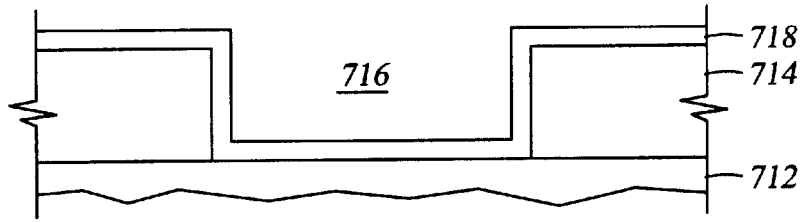

Referring to FIG. 7B, the liner layer 718 is deposited on the dielectric layer 714 and in the aperture 716 from the disassociation of an organometallic precursor having the formula $(Cp(R)_n)_xM(CO)_{y-x}$ in the presence of a processing gas, preferably at a pressure of less than 20 Torr. The liner layer 718 improves adhesion between the substrate or dielectric layer 714 and the subsequently deposited conducting metal layer 720. The liner layer 718 comprises tantalum deposited by either thermal disassociation or plasma enhanced disassociation of a tantalum precursor in the presence of a non-nitrating processing gas.

An exemplary deposition regime for depositing a tantalum liner layer 718 by thermal disassociation is as follows. An orgamomettalic precursor having the composition of (trimethylsilylcyclopentadienyl) tetracarbonyltantalum, $((Si(CH_3)_3)C_5H_4)Ta(CO)_4$, formed when R is trimethylsilyl, —Si(CH$_3$)$_3$, n is 1, x is 1, M is tantalum, y is 5, and y–x is 4, is used to deposit the tantalum layer 718. The organometallic precursor is introduced into the chamber at a flow rate of between about 5 sccm and about 500 sccm, and a processing gas of a non-nitrating gas such as argon, hydrogen and combinations thereof, is introduced into the chamber at a flow rate of between about 5 sccm and about 500 sccm. In one embodiment of the deposition process, the flow rate for the precursor and the processing gas is established to produce a molar ratio of precursor to processing gas of about 1:1.

The chamber is maintained at a pressure of less than about 20 Torr. The chamber is preferably maintained at a pressure between about 100 milliTorr and about 20 Torr. In one embodiment of the deposition regime, the pressure is maintained between about 100 milliTorr and about 250 milliTorr during the deposition of the film. The substrate is heated to a temperature between about 100° C. and about 450° C. to ensure deposition of the metal on the substrate surface. A substrate temperature between about 250° C. and about 450° C. is preferably used to deposit the layer. Alternatively, a temperature of 400° C. is used to ensure deposition of the metal on the substrate surface. The above described regime can produce a deposition rate from between about 30 angstroms (Å) and about 50 Å per minute, with a total layer thickness preferably being between about 50 Å and about 100 Å thick.

Plasma-enhanced CVD deposition of the precursor comprises either capacitively or inductively coupling power to generate a plasma in the chamber to enhance disassociation of the organometallic precursor to deposit the liner layer 718 on the substrate. A power density between about 0.6 Watts/cm$^2$ and about 3.2 Watts/cm$^2$, or at a power level between about 200 Watts and about 1000 Watts, and in one embodiment at about 750 W, for a 200 mm substrate, is supplied to the processing chamber to generate the plasma.

The chamber is maintained at a pressure of less than about 20 Torr. The chamber is preferably maintained at a pressure between about 100 milliTorr and about 20 Torr. Alternatively, the pressure of the chamber is maintained between about 100 milliTorr and about 250 milliTorr for the plasma enhanced deposition of the layer. The substrate is heated to a temperature between about 100° C. and about 450° C. to ensure deposition of the metal on the substrate surface. A substrate temperature between about 250° C. and about 450° C. is preferably used when a plasma-enhance deposition of the layer 718 is performed.

A post-deposition plasma treatment is performed on the deposited liner layer 718 to remove impurities, densify the deposited liner layer 718, and decrease the resistivity of the deposited liner layer 718. A plasma of a non-nitrating gas, such as argon, hydrogen, and combinations thereof is used to treat the liner layer 718. The processing chamber is maintained at a pressure between about 50 milliTorr and about 20 Torr. The substrate temperature during the plasma step is between about 100° C. and about 450° C., and in one embodiment of the deposition process, a temperature between about 250° C. and about 450° C. is used. A power density between about 0.6 Watts/cm$^2$ and about 3.2 Watts/cm$^2$ is supplied to the processing chamber to generate the plasma, or at a power level between about 200 and about 1000 Watts, and in one embodiment about 750 W, for a 200 mm substrate.

The plasma treatment may be performed in the same or different chamber, but is preferably performed in situ with the chamber used to deposit the liner layer 718 so no additional production steps are required for the metallization process and a higher substrate throughput can be achieved. In a preferred embodiment, a liner layer 718 is deposited in an argon plasma, and is post treated in an argon plasma. By forgoing the post-deposition treatment, a tantalum carbide liner layer can be formed on the substrate 712.

Figure 7C:
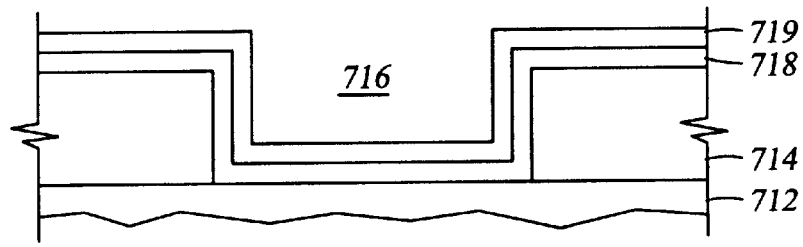

Referring to FIG. 7C, a barrier layer 719 composed of tantalum nitride is conformally deposited on the liner layer 718. The barrier layer 719 is deposited to prevent diffusion of subsequently deposited conducting metal layer 720 into the underlying substrate 712 or dielectric layer 714.

An exemplary deposition regime for depositing a tantalum nitride (Ta$_x$N$_y$, wherein x and y are integers representing: the different phases of tantalum nitride layers, such as TaN and Ta$_3$N$_5$) barrier layer 719 by thermal disassociation is as follows. An organometallic precursor having the composition of (trimethylsilylcyclopentadienyl)tetracarbonyltantalum, ((Si(CH$_3$)$_3$)C$_5$H$_4$)Ta(CO)$_4$, formed when R is trimethylsilyl, —Si(CH$_3$)$_3$, n is 1, x is 1, M is tantalum, y is 5, and y–x is 4, is used to deposit the tantalum nitride barrier layer 719.

The organometallic precursor is introduced into the chamber at a flow rate of between about 5 sccm and about 500 sccm, and a processing gas of a nitrating gas, such as ammonia, nitrogen, a mixture of nitrogen and hydrogen, a mixture of nitrogen and silane, and combinations thereof, is introduced into the chamber at a flow rate of between about 5 sccm and about 500 sccm. In one embodiment of the deposition process, the flow rate for the precursor and the processing gas is established to produce a molar ratio of precursor to processing gas of about 1:1. The processing gases preferably comprise nitrating gases such as nitrogen, a mixture of hydrogen and nitrogen, ammonia, and combinations thereof.

The chamber is maintained at a pressure of less than about 20 Torr. The chamber is preferably maintained at a pressure between about 100 milliTorr and about 20 Torr. In embodiment of the deposition process, the pressure is maintained between about 100 milliTorr and about 250 milliTorr during the deposition of the film. The substrate is heated to a temperature between about 100° C. and about 450° C. to ensure deposition of the metal on the substrate surface. A substrate temperature between about 250° C. and about 450° C. is preferably used to deposit the layer 719. Alternatively, a temperature of 400° C. is used to ensure deposition of the metal nitride on the substrate surface. For the tantalum nitride barrier layer 719, the above described regime can produce a deposition rate from between about 30 angstroms (Å) and about 50 Å per minute, with a total layer thickness preferably being between about 50 Å and about 100 Å thick.

Plasma-enhanced CVD deposition of the metal nitride layer 719 comprises either capacitively or inductively coupling power to generate a plasma by supplying a power density between about 0.6 Watts/cm$^2$ and about 3.2 Watts/cm$^2$, or at a power level between about 200 Watts and about 1000 Watts, and in one embodiment at about 750 W, for a 200 mm substrate, to the processing chamber.

The chamber is maintained at a pressure of less than about 20 Torr. The chamber is preferably maintained at a pressure between about 100 milliTorr and about 20 Torr. Alternatively, the pressure of the chamber is maintained between about 100 milliTorr and about 250 milliTorr for the plasma enhanced deposition of the layer. The substrate is heated to a temperature between about 100° C. and about 450° C. to ensure deposition of the metal on the substrate surface. A substrate temperature between about 250° C. and about 450° C. is preferably used when a plasma-enhance deposition of the layer is performed.

A post-deposition plasma treatment is performed on the deposited barrier layer 719. A plasma of a non-nitrating gas, such as argon, hydrogen, and combinations thereof, is used to treat the barrier layer 719. The processing chamber is maintained at a pressure between about 50 milliTorr and about 20 Torr. The substrate temperature during the plasma step is between about 100° C. and about 450° C., and preferably, at a substrate temperature between about 250° C. and about 450° C.

A power density between about 0.6 Watts/cm$^2$ and about 3.2 Watts/cm$^2$, or at a power level between about 200 and about 1000 Watts, and in one embodiment at about 750 W, for a 200 mm substrate, is supplied to the chamber to generate the plasma. In a preferred embodiment, a barrier layer 719 is deposited in an argon plasma, and is post treated in an argon plasma. In another embodiment of the processing regime, a tantalum carbon nitride layer can be deposited by foregoing the post-deposition plasma treatment.

The plasma treatment may be performed in the same or different chamber, but is preferably performed in situ with the chamber used to deposit the liner layer 718 so no additional production steps are required for the metallization process and a higher substrate throughput can be achieved.

Preferably, the same precursor is used for the deposition of both the metal liner layer 718 and metal nitride barrier layer 719. The same precursor deposited with different processing gas compositions allows for metal and metal nitride depositions to occur in the same chamber under similar processing conditions resulting in faster substrate throughput and minimal contamination.

Further, the deposition of the liner layer, the plasma treatment of the liner layer, the deposition of the barrier layer, and the plasma treatment of the barrier layer can be performed in the same chamber or in the same system with breaking a vacuum. The deposition and treatment of the liner and barrier layers in the same chamber is believed to reduce processing time as well as increase substrate throughput.

Additionally, the barrier layer 719 may also perform as an adhesion layer between the substrate 712 and the conducting metal layer 720 when a liner layer 718 is not used in the metallization stack. The barrier layer 719 may also perform as a seed layer for deposition of the conducting metal layer, preferably for a copper layer, by an electroplating process.

Figure 7D:
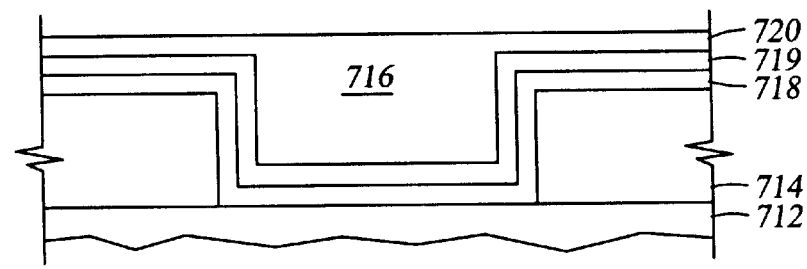

FIG. 7D, a conducting metal layer 720, preferably copper, is deposited on the barrier layer 719. The conducting metal layer 720 may comprise a seed layer of a conducting metal and a subsequent deposition of a metal layer on the see layer by a electroplating or electroless process. Preferably, a single conducting metal layer 720 completely fills the aperture 716. The metal layer 720 may be deposited by PVD, IMP, CVD, electroplating, electroless deposition, evaporation, or other known methods.

Preferably, the metal layer 720 comprises copper and is deposited using an electroplating technique. An exemplary electroplating method is described in co-pending U.S. patent application Ser. No. 09/114,865, filed on Jul. 13, 1998, and is incorporated herein by reference to the extent not inconsistent with the invention. After the metal layer 720 is deposited, the substrate 712 may be annealed to recrystallize the copper and remove void formation.

Figure 7E:
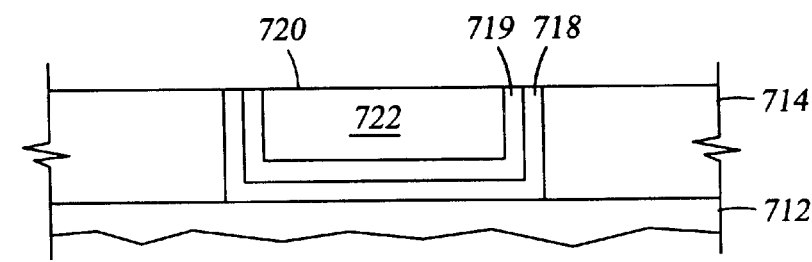

Referring to FIG. 7E, the aperture 716 may be further processed by planarizing the top portion of the metallized layer stack 710, preferably by chemical mechanical polishing (CMP). During the planarization process, portions of the copper layer 718 and the dielectric layer 714 are removed from the top of the structure leaving a fully planar surface with a conductive feature 722 formed therein. Other subsequent processing of the substrate may be performed including additional deposition of layers, etching, further annealing of the substrate, and other processes known to IC manufacturing.

Although the invention is preferably described as using copper deposited by electroplating for metallization of the feature, the invention is applicable to other conducting metals that can be deposited by physical vapor deposition, chemical vapor deposition and electrochemical deposition, such as electroless deposition and electroplating.

A skilled practitioner in the art will understand the need to modify the metal and metal nitride deposition processes of the invention while retaining the basic nature of the processes for performance of the invention with respect to time, pressure, flow rates, plasma power, and temperature and regarding the use of variable equipment, processes, and desired layer characteristics.

HYPOTHETICAL EXAMPLES

The following hypothetical examples demonstrate deposition of precursor described herein to deposit metal and metal nitride layers having excellent barrier and adhesion properties. The examples were undertaken using a chemical vapor deposition chamber, and in particular, a CENTURA TxZ™ system capable of both thermal and plasma enhanced chemical vapor deposition processes, commercially available from Applied Materials, Inc., Santa Clara, Calif.

Tantalum Precursor Formation

Precursors of the invention generally have the formula $(Cp(R)_n)_xM(CO)_{y-x}$, for which preferred precursors, such as $((Si(CH_3)_3)C_5H_4)Ta(CO)_4$, (trimethylsilylcyclopentadienyl) tetracarbonyltantalum, can be formed when Cp is cyclopentadienyl, —$(C_5H_4)$, R is trimethylsilyl, —$Si(CH_3)_3$, n is 1, x is 1, M is tantalum, y is 5, and y−x is 4.

Tantalum Layer deposition: Thermal Disassociation, Hydrogen

A tantalum (Ta) layer is deposited by a vaporized precursor with a 1:1 molar ratio of $((Si(CH_3)_3)C_5H_4)Ta(CO)_4$, (trimethylsilylcyclopentadienyl) tetracarbonyltantalum to hydrogen reactant processing gas at a chamber pressure of 1 Torr with a substrate temperature of 380° C. and chamber walls at a temperature of 80° C. The reactive gases flow into the chamber as follows:

| | |
|---|---|
| $((Si(CH_3)_3)C_5H_4)Ta(CO)_4$, at (trimethylsilylcyclopentadienyl) tetracarbonyltantalum | 25 sccm |
| Hydrogen, $H_2$, at | 25 sccm |
| Argon, Ar, at | 100 sccm. |

A subsequent plasma treatment at a chamber pressure of about 1 Torr with about 750 W of high frequency power (13.56 MHz) is applied to the showerhead for contaminant removal of the deposited tantalum layer, the plasma gases flow into the reactor as follows:

| | |
|---|---|
| $((Si(CH_3)_3)C_5H_4)Ta(CO)_4$, at (trimethylsilylcyclopentadienyl) tetracarbonyltantalum | 0 sccm |
| Hydrogen, $H_2$, at | 0 sccm |
| Argon, Ar, at | 100 sccm. |

Tantalum Nitride Layer Deposition: Plasma Disassociation, Ammonia

A tantalum (Ta) layer is deposited by a vaporized precursor with a 1:1 molar ratio of $((Si(CH_3)_3)C_5H_4)Ta(CO)_4$, (trimethylsilylcyclopentadienyl) tetracarbonyltantalum, to ammonia reactant processing gas at a chamber pressure of 1 Torr with a substrate temperature of 380° C. and chamber walls at a temperature of 80° C. A plasma is generated by applying about 750 W of high frequency power (13.56 MHz) to reactive gases which flow into the reactor as follows:

| | |
|---|---|
| $((CH_3)C_5H_4)Ta(CO)_4$, at (methylcyclopentadienyl) tetracarbonyltantalum | 25 sccm |
| Ammonia, $NH_3$, at | 25 sccm |
| Argon, Ar, at | 100 sccm. |

A subsequent plasma treatment at a chamber pressure of 1 Torr with 750 W of high frequency power (13.56 MHz) is applied to generate the plasma for contaminant removal of the deposited tantalum nitride layer, the plasma gases flow into the reactor as follows:

| | |
|---|---|
| $((CH_3)C_5H_4)Ta(CO)_4$, at (methylcyclopentadienyl) tetracarbonyltantalum | 0 sccm |
| Hydrogen, $H_2$, at | 25 sccm |
| Argon, Ar, at | 100 sccm. |

Niobium Nitride Layer Deposition: Plasma Disassociation, Ammonia Plasma Treatment A niobium (Nb) layer is deposited by a vaporized precursor with a 1:1 molar ratio of $((Si(CH_3)_3)C_5H_4)Nb(CO)_4$, (trimethylsilylcyclopentadienyl) tetracarbonylniobium, to ammonia reactant processing gas at a chamber pressure of 1 Torr with a substrate temperature of 380° C. and chamber walls at a temperature of 80° C. A plasma is generated by applying about 750 W of high frequency power (13.56 MHz) to reactive gases which flow into the reactor as follows:

| | |
|---|---|
| $((Si(CH_3)_3)C_5H_4)Nb(CO)_4$, at (trimethylsilylcyclopentadienyl) tetracarbonylniobium | 25 sccm |
| Ammonia, $NH_3$, at | 25 sccm |
| Argon, Ar, at | 100 sccm. |

A subsequent nitrating plasma treatment is performed at a chamber pressure of 1 Torr with 750 W of high frequency power (13.56 MHz) applied to generate a plasma for contaminant removal of the deposited niobium nitride layer, the plasma gases flow into the reactor as follows:

| | |
|---|---|
| $((Si(CH_3)_3)C_5H_4)Nb(CO)_4$, at (trimethylsilylcyclopentadienyl) tetracarbonylniobium | 0 sccm |
| Ammonia, $NH_3$, at | 25 sccm |
| Argon, Ar, at | 100 sccm. |

While the foregoing is directed to the preferred embodiment of the invention, other and further embodiments of the invention may be devised without departing from the basic scope thereof, and the scope thereof is determined by the claims that follow.

What is claimed is:

1. A method for processing a substrate, comprising:
   introducing a precursor into a processing chamber, the precursor having the formula:

$(Cp(R)_n)_xM(CO)_{y-x}$, wherein:
   Cp is a cyclopentadienyl functional group,
   M is a metal selected from the group consisting of tantalum, niobium, vanadium, and tungsten,
   R is an alkylsilyl group,
   n is an integer from 1 to 5,
   x is an integer from 1 to 5,
   y is the valence of M; and
   disassociating the precursor in the presence of a processing gas to deposit a metal layer or a metal nitride layer.

2. The method of claim 1, wherein the alkyl silyl group has between 1 and 3 hydrocarbyl substituents and is selected from the group consisting of methylsilyl, dimethylsilyl, trimethylsilyl, and combinations thereof.

3. The method of claim 2, wherein n is 1, x is 1, and R is trimethylsilyl.

4. The method of claim 1, wherein the processing gas is selected from the group consisting of hydrogen, nitrogen, ammonia, silane, argon, helium, and combinations thereof.

5. The method of claim 1, wherein the processing chamber is maintained at a pressure of less than about 20 Torr.

6. The method of claim 1, wherein disassociating the precursor comprises heating the substrate to a temperature between about 100° C. and about 450° C.

7. The method of claim 6, wherein disassociating the precursor further comprises generating a plasma at a power density between about 0.6 Watts/cm$^2$ and about 3.2 Watts/cm$^2$.

8. The method of claim 1, further comprising exposing the deposited metal layer or metal nitride layer to a plasma generated at a power density between about 0.6 Watts/cm$^2$ and about 3.2 Watts/cm$^2$.

9. The method of claim 8, wherein the plasma comprises a gas selected from the group consisting of hydrogen, nitrogen, ammonia, argon, helium, and combinations thereof.

10. The method of claim 1, further comprising forming a feature on a substrate comprising depositing a dielectric layer on the substrate and etching an aperture within the dielectric layer to expose the substrate prior to depositing the metal layer or the metal nitride layer.

11. The method of claim 10, wherein forming the feature further comprises reactive pre-cleaning the exposed substrate to remove oxides formed on the substrate prior to depositing the metal layer or the metal nitride layer.

12. The method of claim 11, wherein reactive pre-cleaning the exposed substrate comprises exposing the substrate to a plasma of hydrogen, argon, and combinations thereof, generated at a power density between about 0.03 Watts/cm$^2$ and about 3.2 Watts/cm$^2$.

13. The method of claim 10, further comprising depositing a second metal layer on the metal layer or the metal nitride layer.

14. The method of claim 13, wherein the second metal layer comprises copper and is deposited by an electroplating technique.

15. A method for processing a substrate in a processing chamber, comprising:
   depositing a metal layer on the substrate by the disassociation of a first precursor in the presence of a processing gas; then
   depositing a metal nitride layer on the metal layer by the disassociation of a second precursor in the presence of a nitrating processing gas, wherein the first and second precursors have the formula:

$(Cp(R)_n)_xM(CO)_{y-x}$, wherein:
   Cp is a cyclopentadienyl functional group,
   M is a metal selected from the group consisting of tantalum, niobium, vanadium, and tungsten,
   R is an alkyl silyl group,
   n is an integer from 1 to 5,
   x is an integer from 1 to 5,
   y is the valence of M.

16. The method of claim 15, wherein the alkyl silyl group has between 1 and 3 hydrocarbyl substituents, and is selected from the group consisting of methylsilyl, dimethylsilyl, trimethylsilyl, and combinations thereof.

17. The method of claim 15, wherein the processing chamber is maintained at a pressure of less than about 20 Torr.

18. The method of claim 15 wherein the processing gas is selected from the group consisting of hydrogen, silane, argon, helium, and combinations thereof.

19. The method of claim 15, wherein the nitrating processing gas is selected from the group consisting of nitrogen, ammonia, a mixture of hydrogen and nitrogen, a mixture of silane and nitrogen, and combinations thereof.

20. The method of claim 15, wherein the first and second precursors are the same precursor.

21. The method of claim 15, wherein the metal layer and the metal nitride layer are deposited sequentially in the same chamber.

22. The method of claim 15, wherein the substrate is maintained at a temperature of between about 100° C. and about 450° C.

23. The method of claim 22, wherein the metal layer is deposited by generating a plasma at a power density between about 0.6 Watts/cm$^2$ and about 3.2 Watts/cm$^2$.

24. The method of claim 22, wherein the metal nitride layer is deposited by generating a plasma at a power density between about 0.6 Watts/cm$^2$ and about 3.2 Watts/cm$^2$.

25. The method of claim 15, further comprising exposing the metal layer to a first plasma comprising gases selected from the group consisting of argon, hydrogen, and combinations thereof, generated at a power density between about 0.6 Watts/cm$^2$ and about 3.2 Watts/cm$^2$.

26. The method of claim 15, further comprising exposing the metal nitride layer to a second plasma comprising gases selected from the group consisting of argon, hydrogen, and combinations thereof, generated at a power density between about 0.6 Watts/cm$^2$ and about 3.2 Watts/cm$^2$.

27. The method of claim 15, further comprising forming a feature on a substrate comprising depositing a dielectric layer on the substrate and etching an aperture within the dielectric layer to expose the substrate prior to depositing the metal layer and the metal nitride layer.

28. The method of claim 27, further comprising depositing a second metal layer on the metal nitride layer.

29. The method of claim 28, wherein the second metal layer comprises copper and is deposited by an electroplating technique.

* * * * *

UNITED STATES PATENT AND TRADEMARK OFFICE
CERTIFICATE OF CORRECTION

PATENT NO.    : 6,491,978 B1
DATED         : December 10, 2002
INVENTOR(S)   : Kalyanam It is certified that error appears in the above-identified patent and that said Letters Patent is hereby corrected as shown below:

Column 9,
Line 20, please change "bondingIt" to -- bonding. It --.

Column 15,
Line 21, please change "told" to -- hold --.

Column 18,
Line 38, please change "orgamomettalic" to -- organometallic --.

Column 20,
Line 9, please change "In embodiment" to -- In one embodiment --.

Column 21,
Line 20, please change "see" to -- seed --.

Signed and Sealed this

Eighth Day of July, 2003

JAMES E. ROGAN
*Director of the United States Patent and Trademark Office*